United States Patent
Ninomiya

(10) Patent No.: US 6,512,801 B1
(45) Date of Patent: Jan. 28, 2003

(54) RECEIVER CAPABLE OF SELECTING OPTIMAL VOLTAGE CONTROLLED OSCILLATOR

(75) Inventor: Shuichi Ninomiya, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/315,730

(22) Filed: May 21, 1999

(30) Foreign Application Priority Data

May 26, 1998 (JP) .............................. 10-144849

(51) Int. Cl.[7] .......................... H03K 9/00; H03L 27/06; H03L 27/14; H03L 27/22
(52) U.S. Cl. ...................... 375/316; 375/373; 331/1 R; 331/56; 455/130; 455/260
(58) Field of Search .................................. 375/316, 327, 375/377, 371, 373, 376; 455/130, 150.1, 178.1, 179.1, 188.1, 190.1, 196.1, 260; 331/2, 46, 179, 56, 1 R; 327/156

(56) References Cited

U.S. PATENT DOCUMENTS

| | | | |
|---|---|---|---|
| 4,259,644 A | 3/1981 | Iimura | 331/2 |
| 4,510,461 A * | 4/1985 | Dickes et al. | 331/1 A |
| 5,389,898 A | 2/1995 | Taketoshi et al. | 331/2 |
| 5,574,997 A * | 11/1996 | Hong | |
| 5,686,864 A * | 11/1997 | Martin et al. | 331/1 |
| 6,014,551 A * | 1/2000 | Pesola et al. | 455/86 |
| 6,112,068 A * | 8/2000 | Smith et al. | 455/260 |
| 6,208,875 B1 * | 3/2001 | Damgaard et al. | 455/552 |

FOREIGN PATENT DOCUMENTS

WO      97/09786      3/1997

* cited by examiner

Primary Examiner—Jean Corrielus
(74) Attorney, Agent, or Firm—Wenderoth, Lind & Ponack, L.L.P.

(57) ABSTRACT

A receive control portion activates each of VCOs, and then sets a reference dividing ratio $N_{typ}$ in the programmable divider. With each of the VCOs active, the receive control portion determines whether the PLL circuit locks or not based on a signal inputted during this time. Based on the determination result, the receive control portion then creates pattern data in a first table. A second table is previously stored in memory. Written into the second table is an optimal VCO for each pattern. The receive control portion determines the optimal VCO corresponding to the created pattern data referring to the second table. This allows the receiver to optimally select a VCO at high speed.

5 Claims, 15 Drawing Sheets

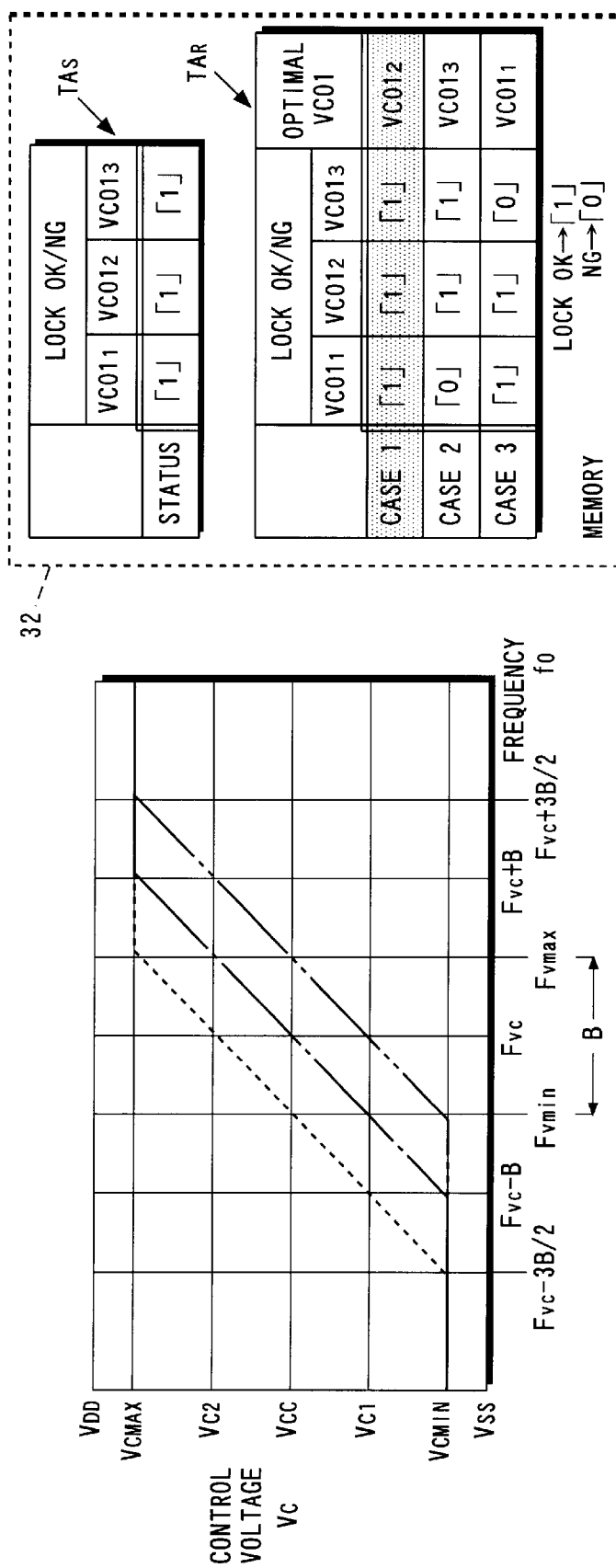

STATE OF MEMORY 32 IN THE CASE OF FREQUENCY fo V.S CONTROL VOLTAGE Vc CHARACTERISTICS SHOWN IN FIG. 5b

FREQUENCY fo V.S CONTROL VOLTAGE Vc CHARACTERISTICS SHIFTED TO LOW FREQUENCY SIDE DUE TO MANUFACTURING DISPERSION

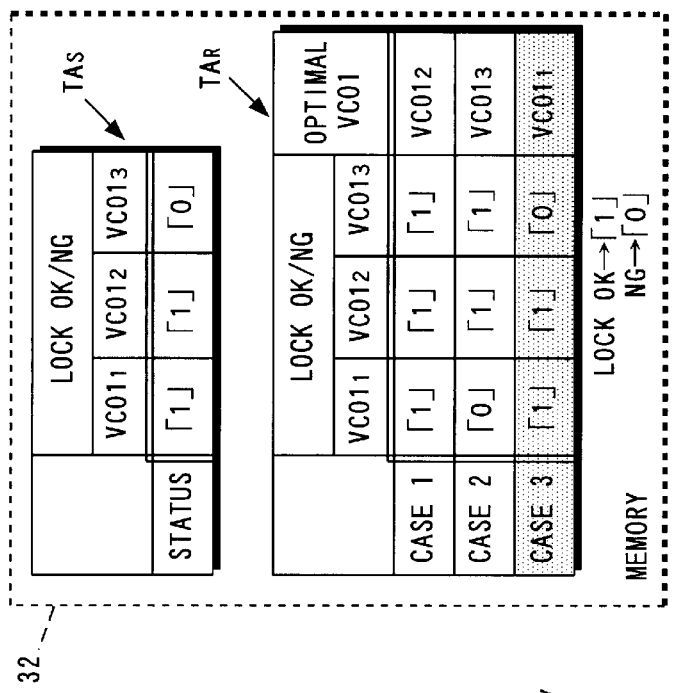
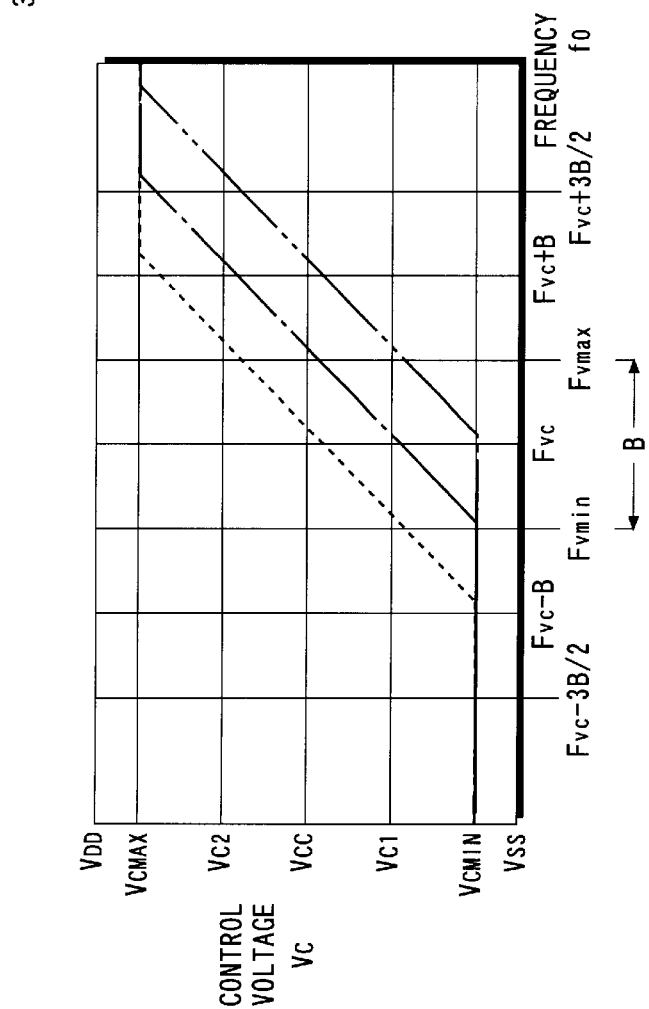

FREQUENCY fo V.S CONTROL VOLTAGE Vc CHARACTERISTICS AS DESIGN TARGET

FREQUENCY fo V.S CONTROL VOLTAGE Vc CHARACTERISTICS SHIFTED DUE TO MANUFACTURING DISPERSION

RECEIVER CAPABLE OF SELECTING OPTIMAL VOLTAGE CONTROLLED OSCILLATOR

BACKGROUND OF THE INVENTION

1. Field of the Invention

The present invention relates to receivers, and more specifically to a receiver for down-converting an inputted signal via an antenna and then demodulating the converted signal.

2. Description of the Background Art

Conventionally, in some cases, a receiver down-converts a signal S inputted from outside to a signal with an intermediate frequency band (hereinafter referred to as IF band). Down-conversion can be realized by mixing the inputted signal S (frequency $f_S$) with a local oscillation output $V_O$ (frequency $f_O$) in a mixer inside the receiver.

The local oscillation output $V_O$ is conventionally generated by a voltage controlled oscillator (hereinafter referred to as VCO) having a circuitry constitution as shown in FIG. 11. The VCO of FIG. 11 is structured of discrete components, comprising a surface acoustic wave (SAW) resonator 111, a variable capacitance diode 112 and other components. Note that FIG. 11 also shows an equivalent circuit of the SAW resonator 111. The variable capacitance diode 112 is connected in parallel to the SAW resonator 111. With the capacity of the variable capacitance diode 112 adjusted and further with a predetermined control voltage $V_C$ applied to the VCO, the VCO generates the local oscillation output $V_O$ having variable frequency.

The SAW resonator 111 is expensive and large in size, and its peripheral circuits are structured of discrete components. It is therefore difficult to downsize the VCO and construct it at low cost, and furthermore know-how for mounting these components is required. Against such background, the VCO has come to be constituted on an integrated circuit. FIG. 12 shows a circuit diagram of a VCO constituted on an integrated circuit. As compared with the VCO of FIG. 11, the VCO of FIG. 12 is different in that it takes an integrated circuit form and that an LC oscillator 121 is substituted for the SAW resonator 111.

Assume that a large number of ICs including the VCOs of FIG. 12 are manufactured under certain conditions. For each of the VCOs, a characteristic of the frequency $f_O$ of the local oscillation output $V_O$ with respect to the control voltage $V_C$ (hereinafter referred to as $f_O$ vs. $V_C$ characteristic) is measured. The $f_O$ vs. $V_C$ characteristic curve has a linear region and a saturation region. Furthermore, the $f_O$ vs. $V_C$ characteristic curves disperse with a constant deviation from a design target of the VCOs (refer to a double-headed arrow in FIG. 13). Such dispersion is hereinafter referred to as manufacturing dispersion. Due to this manufacturing dispersion, the saturation region of the $f_O$ vs. $V_C$ characteristic curve is within a receive band B in some cases. As a result, the receiver cannot down-convert the inputted signal S correctly. It is therefore ideal that each VCO manufactured under the same conditions does not have manufacturing dispersion, which is however difficult in reality. The receive band B is a frequency band which the receiver including the VCOs has to receive and also with which the above signal S is sent out.

For this reason, the following method has been considered. A plurality of VCOs with different $f_O$ vs. $V_C$ characteristic curves from each other are integrated in an IC. When the control voltage $V_C$ of the same level is applied, the plurality of VCOs generate the local oscillation output $V_O$ with a different frequency $f_O$, respectively. A VCO control portion is placed on the periphery of each of such VCOs. The VCO control portion has to select one VCO whose $f_O$ vs. $V_C$ characteristic curve reliably covers the receive band B from among the plurality of VCOs. Further, this selecting processing is preferably carried out at high speed.

SUMMARY OF THE INVENTION

Therefore, an object of the present invention is to provide a receiver for selecting an appropriate VCO at high speed. This object is achieved by the following aspects. Further, each aspect has unique technical effects as described below.

A first aspect of the present invention is directed to a receiver for subjecting an inputted signal via an antenna to down-conversion and then demodulating the converted signal, comprising:

a plurality of voltage controlled oscillators (hereinafter referred to as VCOs), each provided with a common control voltage and generating a local oscillation output having a different frequency according to the control voltage;

a PLL circuit for generating the control voltage based on the local oscillation output fed back from each of the VCOs and a reference signal having a reference frequency;

a mixer for mixing frequencies of the inputted signal via the antenna and the local oscillation output from each of the VCOs, and performing the down-conversion; and a VCO control portion for testing each of the VCOs in a test mode to be executed in advance, and controlling switching of the VCOs in a receive mode of receiving the inputted signal via the antenna;

in the test mode, the VCO control portion detecting whether the PLL circuit locks using the local oscillation output from each of the VCOs or not as sequentially switching and activating the VCOs, and determining one appropriate VCO based on a detected result;

in the receive mode, the VCO control portion selectively activating the VCO determined in the test mode, and providing a local oscillation output of the VCO f or the mixer.

In the first aspect, in the test mode, the appropriate VCO is selected for use in the receive mode. In this test mode, the VCO control portion sequentially switches and activates the VCOs to determine an optimal VCO based on the detected result as to whether the PLL circuit locks using the local oscillation output from each VCO. Therefore, in the receive mode, the mixer performs down-conversion using the local oscillation output from the VCO with which the PLL circuit reliably locks. This allows the receiver according to the first aspect to select an appropriate VCO for the above down-conversion.

According to a second aspect, in the first aspect, the VCO control portion holds the detected result in a first table as pattern data, refers to a second table into which the appropriate VCO for each assumed pattern is written, and determines the appropriate VCO corresponding to the pattern data held in the first table.

In the second aspect, the VCO control portion determines the optimal VCO corresponding to the pattern data stored in the first table referring to the second table. Previously written into the second table are assumed patterns and their corresponding optimal VCOs. This allows the receiver according to the second aspect to select the optimal VCO corresponding to the detected result.

According to a third aspect, in the first aspect, the second table is configured based on manufacturing dispersion of the VCOs.

In accordance with the third aspect, the second table is configured based on the above manufacturing dispersion. This allows the receiver according to the third aspect to select the optimal VCO irrespective of manufacturing dispersion of the VCOs.

According to a fourth aspect, in the first aspect, the PLL circuit includes a programmable divider for dividing the fed-back local oscillation output using a predetermined dividing ratio set by the VCO control portion, and generates a control voltage based on a local oscillation output divided by the programmable divider and the reference signal; and in the test mode, the VCO control portion sets a reference dividing ratio with which each of the VCOs can generate a local oscillation output having a frequency within a band in which the inputted signal is included as the predetermined dividing ratio.

In accordance with the fourth aspect, since the reference dividing ratio as described above is set in the programmable divider, it is possible to let the PLL circuit lock according to the inputted signal.

According to a fifth aspect, in the fourth aspect, the reference dividing ratio is a dividing ratio with which each of the VCOs can generate a local oscillation output having a center frequency of the band.

In the fifth aspect, as evident from the above, the reference dividing ratio is set based on a center frequency of the above band, that is, an average value, and PLL circuit can thus lock at the highest speed. This allows the receiver to execute the test mode in the shortest time.

According to a sixth aspect, in the first aspect, the VCO control portion stores information of the VCO determined in the test mode executed last time; and when executing the test mode again, the VCO control portion first tests the stored information of the VCO and determines again that the VCO is an optimal VCO when the PLL circuit locks using the local oscillation output from the VCO.

In accordance with the sixth aspect, when it is determined again that the VCO first tested is the optimal one at the time of executing the test mode again, the VCO control portion makes a transition to the receive mode. This can reduce the time for a transition from the test mode to the receive mode.

According to a seventh aspect, in the first aspect, the PLL circuit and each of the VCOs are integrated in a same circuit.

In accordance with the seventh aspect, the above integration in a circuit allows reduction in size and cost of the receiver. Further, unlike when discrete components are used, know-how about mounting the components is not required for manufacturing the receiver.

An eighth aspect is directed to a receiver for subjecting a signal inputted via an antenna to down-conversion and then demodulating the converted signal, comprising:

a plurality of voltage controlled oscillators (hereinafter referred to as VCOs), each provided with common control voltage and generating a local oscillation output having a different frequency according to the control voltage;

a PLL circuit for generating the control voltage based on the local oscillation output fed back from each of the VCOs and a reference signal having a reference frequency;

a mixer for mixing frequencies of the inputted signal via the antenna and the local oscillation output from each of the VCOs, and performing the down-conversion; and a VCO control portion for testing each of the VCOs in a test mode to be executed in advance, and controlling switching of the VCOs in a receive mode of receiving the signal inputted via the antenna;

in the test mode, the VCO control portion
detecting whether the PLL circuit locks using the local oscillation output from each of the VCOs as sequentially switching and activating the VCOs, and when a value of the control voltage generated by the PLL circuit is within a predetermined range, determining which one of the VCOs provided with the control voltage is an appropriate VCO;

in the receive mode, the VCO control portion
selectively activating the VCO determined in the test mode, and providing a local oscillation output of the VCO for the mixer.

In the eighth aspect, in the test mode, the optimal VCO is selected for use in the receive mode. In this test mode, the VCO control portion sequentially switches and activates the VCOs to determine an optimal VCO based on the detection result as to whether the PLL circuit locks using the local oscillation output from each VCO or not and based on whether the control voltage value which the PLL circuit generates using the local oscillation output is within a predetermined range or not. On detecting the VCO which satisfies these two conditions, the VCO control portion determines that this VCO is the optimal one. Therefore, in some cases, the VCO control portion does not activate all VCOs. This allows the receiver according to the eighth aspect to execute the test mode at higher speed than the receiver according to the first aspect and to make a transition to the receive mode. Furthermore, in the receive mode, the mixer performs down-conversion using the local oscillation output from the VCO with which the PLL circuit reliably locks. This allows the receiver according to the eighth aspect to select an appropriate VCO for the above down-conversion from among the plurality of VCOs.

According to a ninth aspect, in the eighth aspect, the predetermined range includes only one value of the control voltage which is provided when each of the VCOs generates a local oscillation output having a same frequency.

In the ninth aspect, the control portion determines an optimal VCO based on the above predetermined range, and therefore only the optimal VCO can be selected.

According to a tenth aspect, in the eighth aspect, the PLL circuit includes a programmable divider for dividing the fed-back local oscillation output using a predetermined dividing ratio set by the VCO control portion, and generates a control voltage based on a local oscillation output divided by the programmable divider and the reference signal; and in the test mode, the VCO control portion sets a reference dividing ratio with which each of the VCOs can generate a local oscillation output having a frequency within a band in which the inputted signal is included as the predetermined dividing ratio.

According to an eleventh aspect, in the tenth aspect, the reference dividing ratio is a dividing ratio with which each of the VCOs can generate a local oscillation output having a center frequency of the band.

According to a twelfth aspect, in the eighth aspect, the VCO control portion stores information of the VCO previously determined in the test mode executed last time; and when executing the test mode again, the VCO control portion first tests the stored information of the VCO and determines again that the VCO is an optimal VCO when the PLL circuit locks using the local oscillation output from the VCO.

According to a thirteenth aspect, in the eighth aspect, the PLL circuit and each of the VCOs are integrated in a same circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
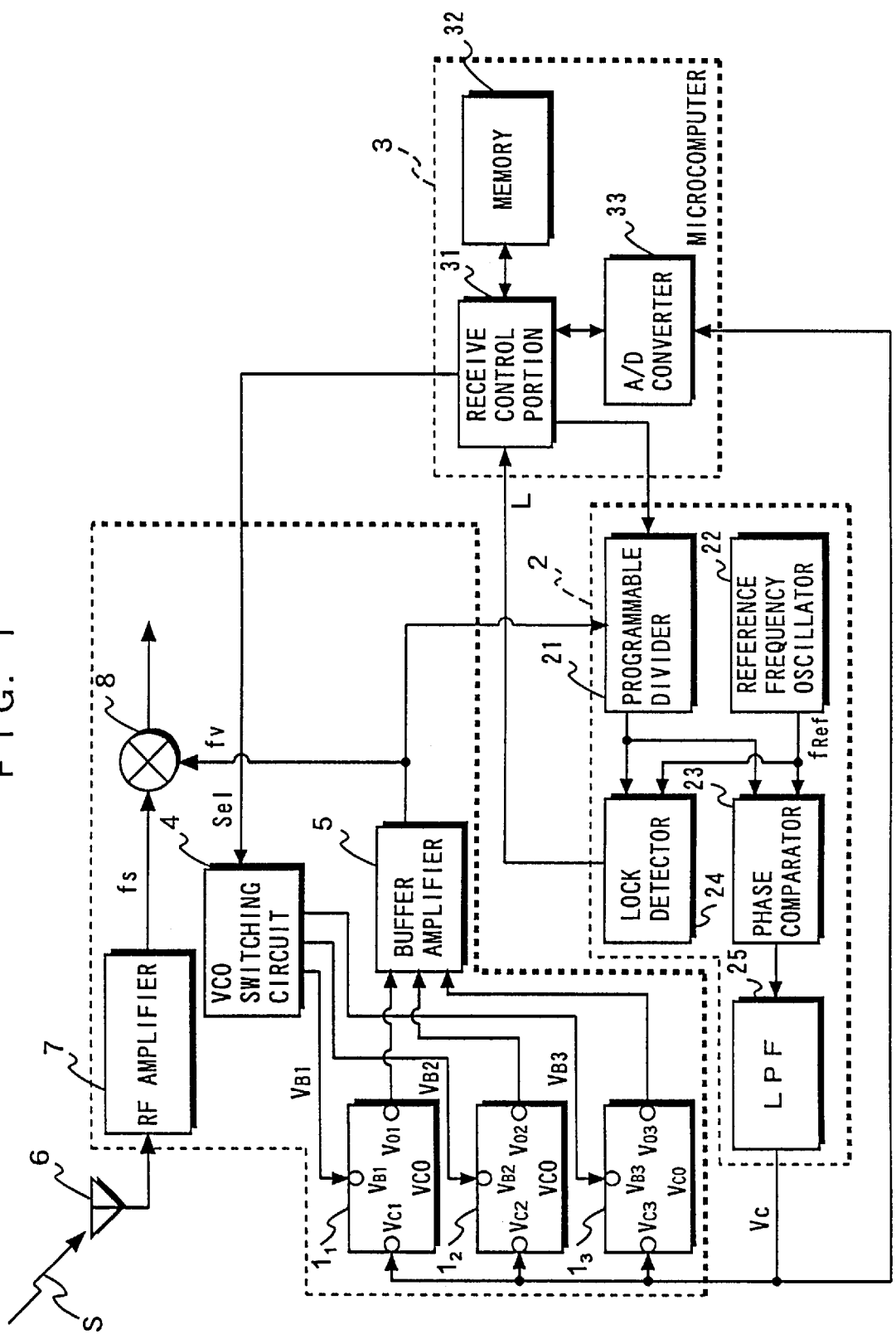
FIG. 1 shows the block structure of a receiver according to first to fourth embodiments of the present invention.

FIG. 1 is a block diagram showing the structure of a receiver according to first to fourth embodiments of the present invention. In FIG. 1, the receiver includes a plurality of (three, in FIG. 1) VCOs, VCO $1_1$ to VCO $1_3$, to be controlled, a phase locked loop (PLL) circuit 2, a microcomputer 3, a VCO switching circuit 4, a buffer amplifier 5, an antenna 6, an RF amplifier 7 and a mixer 8. Preferably, the VCO $1_1$ to VCO $1_3$, the PLL circuit 2, the VCO switching circuit 4, the buffer amplifier 5, the RF amplifier 7 and the mixer 8 are integrated inside an integrated circuit.

The PLL circuit 2 includes a programmable divider 21, a reference frequency oscillator 22, a phase comparator 23, a lock detector 24 and a low pass filter (LPF) 25. The microcomputer 3 includes a receive control portion 31, memory 32 and an A/D converter 33. The microcomputer 3 and the VCO switching circuit 4 construct a VCO control portion.

Figure 2:
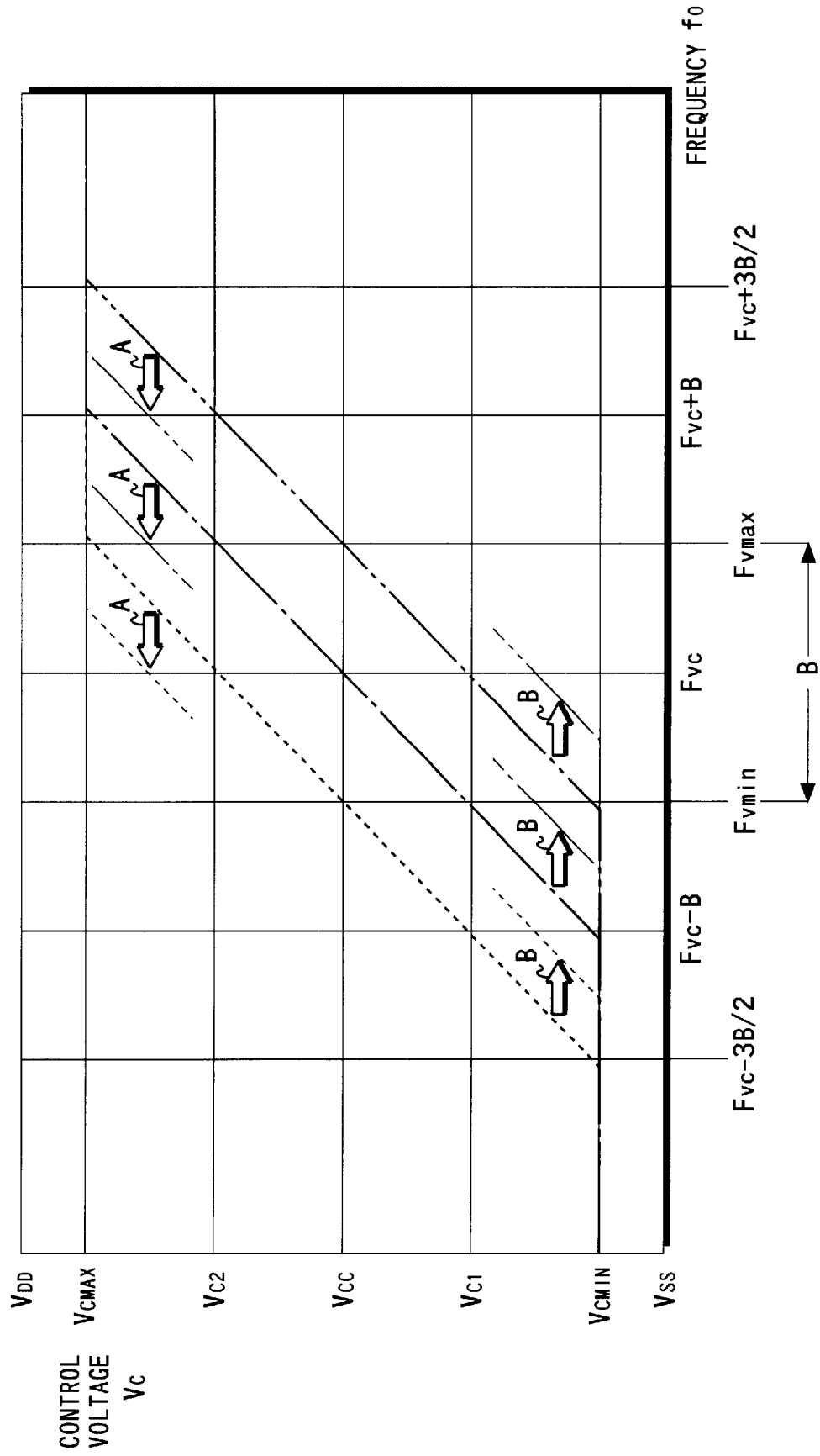
FIG. 2 shows frequency $f_O$ vs. control voltage $V_C$ characteristics of a VOC $1_1$ lto a VOC $1_3$.

Described next are $f_O$ vs. $V_C$ characteristics (described above) of VCO $1_1$ to VCO $1_3$ referring to FIG. 2. In the graph of FIG. 2, the lateral axis represents the frequency $f_O$ of the local oscillation output, and the horizontal axis represents the control voltage $V_C$.

A receive band B is a receive frequency band of the receiver and also a frequency band within which a signal S transmitted from outside to the receiver is included. More specifically, when the signal S is within an L band (1.45 to 1.49 [GHz]), for example, of the receive band B is within approximately 1.45 to 1.49 [GHz]. A center frequency $F_{VC}$ is a center of the receive band B. A minimum frequency $F_{VMIN}$ is a minimum frequency of the receive band B, while a maximum frequency $F_{VMAX}$ is its maximum frequency. Under such conditions, the VCO $1_1$ to VCO $1_3$ are designed under a design target as described below.

The VCO $1_2$ is designed so as to generate a local oscillation output $V_{O2}$ having the center frequency $F_{VC}$ when a control voltage $V_{CC}$ is applied from the PLL circuit 2. The VCO $1_2$ is also designed so as to generate the local oscillation output $V_{O2}$ with the minimum frequency $F_{VMIN}$ and the maximum frequency $F_{VMAX}$ when control voltages $V_{C1}$ and $V_{C2}$ are applied, respectively. Furthermore, in consideration of manufacturing dispersion, the VCO $1_2$ is generally designed so that its local oscillation frequency band is approximately not less than twice as wide as the receive band B. The oscillation frequency band of the VCO $1_2$ is preferably within from $F_{VC}$−B to $F_{VC}$+B. The VCO $1_2$ is designed so as to generate the local oscillation output $V_{O2}$ with a center frequency $F_{VC}$−B when a control voltage $V_{C1}$ is applied and with a center frequency $F_{VC}$+B when a control voltage $V_{C2}$ is applied, respectively. Therefore, the $f_O$ vs. $V_C$ characteristic of the VCO $1_2$ becomes as shown by a one-dot-chain line in FIG. 2. The $f_O$ vs. $V_C$ characteristic curve is shaped linearly within the oscillation frequency band of the VCO $1_2$, while nonlinearly (or in the saturation regions) outside this band.

The VCO $1_1$ and the VCO $1_3$ are designed with reference to the $f_O$ vs. $V_C$ characteristic of the VCO $1_2$. Specifically, as shown in FIG. 2, when the above signal S is of the L band (described above), the VCO $1_1$ and the VCO $1_3$ are designed so as to have $f_O$ vs. $V_C$ characteristic shifted by approximately B/2 to the low frequency side and the high frequency side, respectively, as compared with the $f_O$ vs. $V_C$ characteristic of the VCO $1_2$. The $f_O$ vs. $V_C$ characteristic curves of the VCO $1_1$ and the VCO $1_3$ are shown by a dotted line and a two-dot-chain line, respectively, in FIG. 2. Each of these $f_O$ vs. $V_C$ characteristic curves also has a linear region and a saturation region. The VCO $1_1$ and the VCO $1_3$ are designed as described above.

Referring to FIG. 2, it can be seen that each of the VCO $1_1$ to VCO $1_3$ oscillates different frequencies $f_{VO1}$ to $f_{VO3}$, respectively, when the control voltage $V_C$ is constant within the range of $V_{CMIN} < V_C < V_{CMAX}$.

The $f_O$ vs. $V_C$ characteristic curves may be shifted as a whole in an arrow direction A or B with respect to the above design target due to manufacturing dispersion.

Furthermore, each VCO is provided with a VCO number. This VCO number is uniquely provided in advance for each of the plurality of VCOs in order to identify each VCO. In this description, the VCO $1_1$ to the VCO $1_3$ are provided with VCO numbers "1" to "3", respectively.

Figure 3:
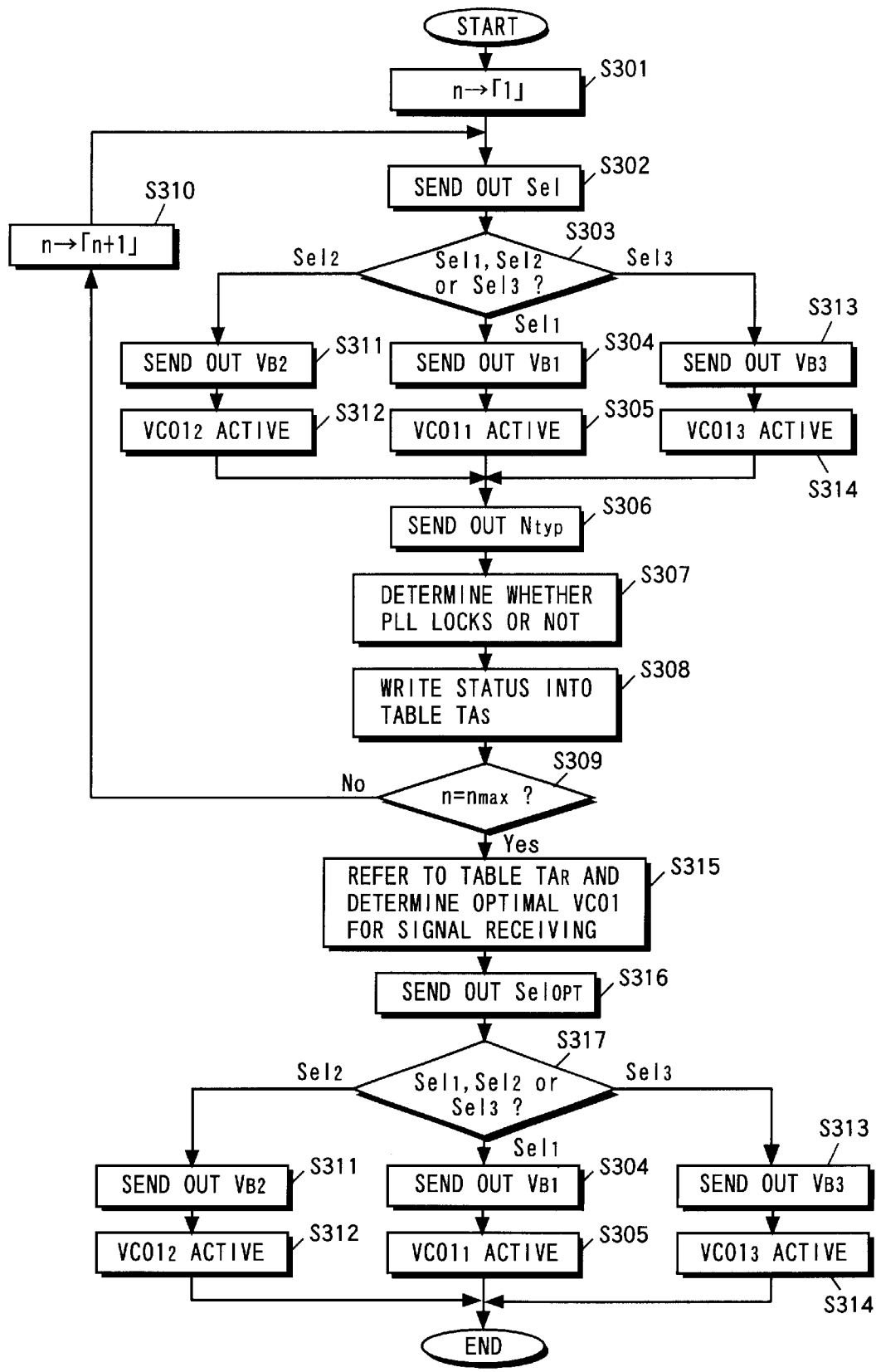
FIG. 3 is a flow chart showing the procedure of a test mode of the first embodiment.

FIG. 3 is a flow chart showing the procedure of a test mode to be executed by the receiver according to the first embodiment. A program for realizing this procedure is previously stored in ROM (not shown) and the like within the microcomputer 3. Note that flow charts of FIGS. 6, 8 and 10, which will be described later, show the procedure of a test mode according to the second, third and fourth embodiments, respectively, and a program for realizing the procedure is also previously stored in ROM and the like.

Described below is operation of the receiver of the first embodiment based on FIGS. 1 to 3. Note that the receivers according to the first and third embodiments do not use the A/D converter 33.

The receive control portion 31 starts the test mode immediately after the receiver is powered on. The receive control portion 31 then sets a VCO number "n" to an initial number "1" (step S301) and thereby selects the VCO $1_1$ to be tested.

The receive control portion 31 then sends out a signal Sel (step S302) to notify the VCO switching circuit 4 of the selected VCO 1. The signal Sel has three types: $Sel_1$, $Sel_2$ and $Sel_3$, which are signals for notifying selection of the VCO $1_1$, VCO $1_2$ and VCO $1_3$, respectively. At this time, $Sel_1$ is sent out.

Based on the type of the inputted Sel, the VCO switching circuit 4 recognizes the selected VCO 1 (step S303), and outputs a signal $V_B$ for activating the VCO 1 to be tested (step S304, S311 or S313). The signal $V_B$ also has three types: $V_{B1}$, $V_{B2}$ and $V_{B3}$, which are signals for activating the VCO $1_1$, VCO $1_2$ and VCO $1_3$, respectively. At this time, the VCO switching circuit 4 recognizes that the VCO $1_1$ has been selected, and therefore sends out $V_{B1}$ (step S304). As a result, at this time, the VCO $1_1$ is activated (step S305), while the VCO $1_2$ and the VCO $1_3$ are not.

The receive control portion 31 sends out Sel in step S302, and then a signal $N_{typ}$ after any one of the VCOs 1 starts being active (step S306) to set a dividing ratio of the programmable divider 21. $N_{typ}$ is a signal preferably for setting a dividing ratio with which the VCO $1_1$ to the VCO $1_3$ can generate the local oscillation outputs $V_{O1}$ to $V_{O3}$ with the center frequency $F_{VC}$, respectively, in consideration that the PLL circuit 2 can lock at high speed. It is to be noted that $N_{typ}$ is not restricted as described above, but may be a signal for setting a dividing ratio with which the VCO $1_1$ to the VCO $1_3$ can generate the local oscillation outputs $V_{O1}$ to $V_{O3}$, respectively, with any frequency within the range of $F_{VMIN}$ to $F_{Vmax}$.

The PLL circuit 2 starts being active when $N_{typ}$ is set in the programmable divider 21 and any of the VCOs 1 starts operation.

Specifically, inputted in the programmable divider 21 is a local oscillation output $V_O$ generated by the currently active VCO 1. The programmable divider 21 divides the inputted local oscillation output $V_O$ using the dividing ratio $N_{typ}$. The reference frequency generator 22 outputs a reference signal RS having a predetermined reference frequency $F_{REF}$. Both of the divided local oscillation output $V_O$ and the reference signal RS are inputted to the phase comparator 23 and the lock detector 24. The phase comparator 23 compares phases between the inputted local oscillation output $V_O$ and the reference signal RS, and outputs the obtained result to the LPF 25. Based on the inputted result, the LPF 25 generates a signal indicating an instantaneous phase difference between the local oscillation output $V_O$ and the reference signal RS as a direct-current control signal $V_C$ by low pass filtering, and outputs to the active VCO 1. The PLL circuit 2 controls the oscillation frequency $f_{VO}$ of the VCO 1 by the control signal $V_{C1}$ so that the oscillation frequency f., matches the frequency $F_{REF}$. This tracking is herein referred to as "the PLL circuit 2 locks". For this locking, $V_C$ has to satisfy a conditional equation $V_{CMIN} < V_C < V_{CMAX}$(1). In the course of tracking, the local oscillation output $V_O$ generated by the active VCO 1 is fed back to the programmable divider 2.

The lock detector 24 also compares the phases between the inputted local oscillation output $V_O$ and the signal RS.

The obtained result has a voltage level correlating with the control voltage $V_C$. The lock detector 24 determines whether the voltage level of the result satisfies the above conditional equation (1), and generates a signal L for notifying the receive control portion 31 of the determination result. The signal L has two types. When the voltage level satisfies the conditional equation (1), the lock detector 24 generates a signal $L_1$ indicating that the PLL circuit 2 locks, and outputs to the receive control portion 31. On the other hand, when the voltage level does not satisfy the conditional equation (1), the lock detector 24 generates a signal $L_2$ indicating that the PLL circuit 2 does not lock, and outputs to the receive control portion 31.

Figure 4:
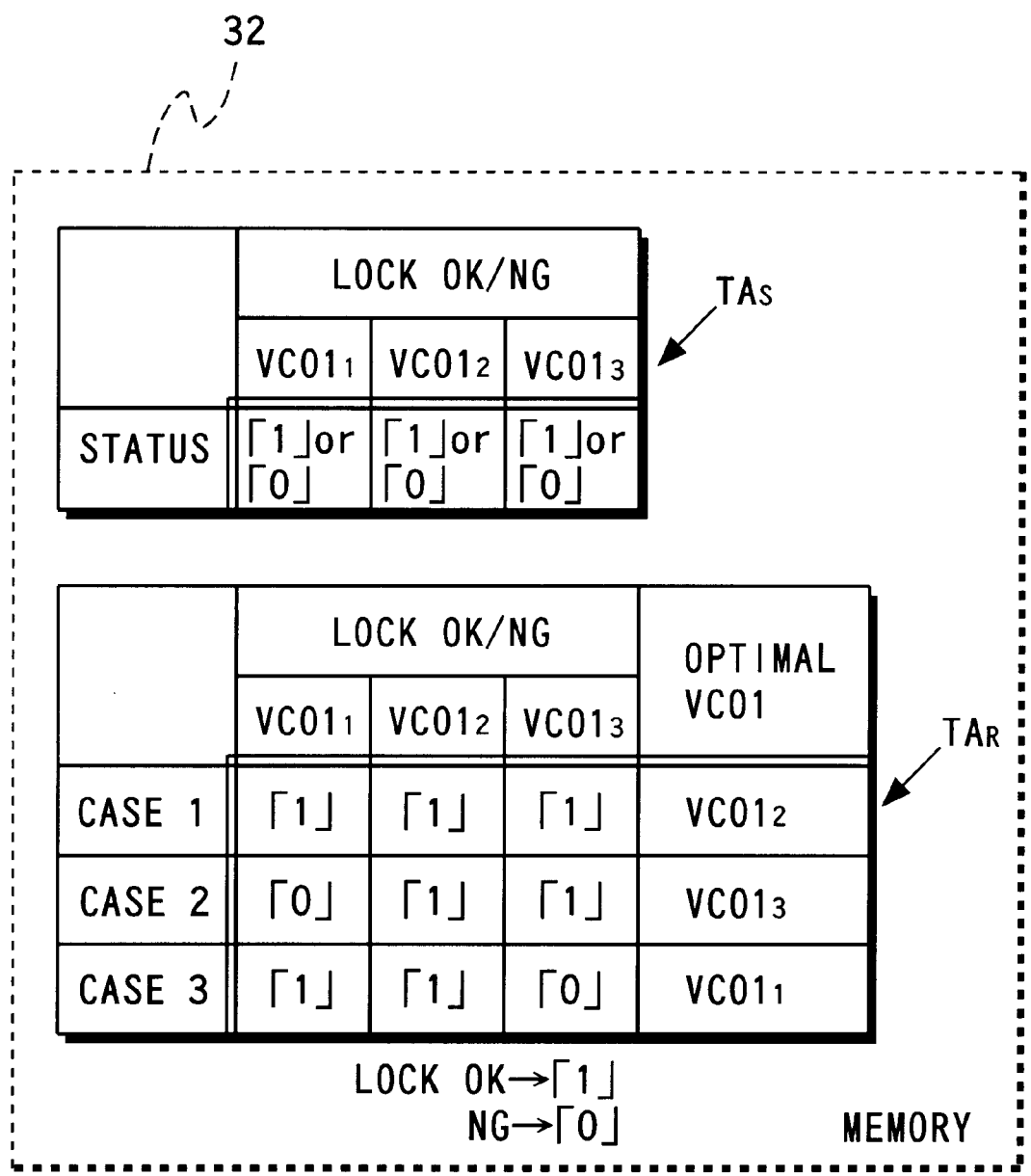
FIG. 4 shows a first table $TA_S$ and a second table $TA_R$.

With the above described signal L inputted, the receive control portion 311 determines whether the PLL circuit 2 locks using the oscillation frequency output generated by the active VCO 1 according to the type of signal L (step S307), and writes the determination result as a status into a first table $TA_S$ as shown in FIG. 4 (step S308). The first table $TA_S$ of FIG. 4 is previously provided in the memory 32. The first table $TA_S$ is configured so that a status is written for each VCO 1. For example, when the VCO $1_1$ is selected and the PLL circuit 2 locks, 1 is written into an appropriate field on the first table $TA_S$ On the other hand, when the PLL circuit 2 does not lock, 0 is written into The receive control portion 31 next determines whether $n=n_{max}$ (step S309), where $n_{MAX}$ is a maximum value of the VCO number "n", which is "3" in the first embodiment. When $n \neq n_{MAX}$, the receive control portion 31 determines that one or more VCOs 1 to be tested still remain, and the procedure advances to step S310. On the other hand, when $n=n_{MAX}$, the receive control portion 31 determines that no VCO 1 to be tested remains, and the procedure advances to step S315.

Since n="1" at this moment, the receive control portion 31 updates "n" to "n+1" (step S311), and selects the VCO $1_2$ which is the VCO 1 with the next VCO number "2" provided. In this case, steps S302→S303→S311→S312 of FIG. 3 are sequentially executed. In this procedure, $Sel_2$ and $V_{B2}$ are outputted (steps S302 and S311), and as a result only the VCO $1_2$ is activated (step S312). The receive control portion 31 then executes steps S306 to S308 to write the status of the VCO $1_2$ into the first table $TA_S$ (step S308).

Next, since n=2 at this moment, the receive control portion 31 updates "n" to "n+1" (step S311), and then sequentially executes steps S302→S303→S313→S314. In this procedure, $Sel_3$ and $V_{B3}$ are outputted (steps S302 and S313), and as a result only the VCO $1_3$ is activated (step S314). The receive control portion 31 then executes steps S306 to S308 to write the status of the VCO $1_3$ into the first table $TA_S$ (step S308).

The receive control portion 31 next executes step S309. Since $n=n_{MAX}$ (=3) at this moment, the procedure advances to step S315. As described above, the receive control portion 31 sets the above predetermined dividing ratio $N_{typ}$ in the programmable divider 21, and determines whether the PLL circuit 2 locks as to the VCO $1_1$ to VCO $1_3$ in sequence. Based on the determination result, the receive control portion 31 then writes the status of the VCO $1^1$ to VCO $1_3$ into the first table $TA_S$. As a result, three-digit binary information (0 or 1) is created in the first table $TA_S$. The pattern of the binary information, that is, pattern data, is any one of "1, 1, 1", "1, 1, 0" or "0, 1, 1", as described later. Note that the pattern data represents the status of the VCO $1^1$, VCO $1_2$ and VCO $1_3$, sequentially fro the left value.

In addition, a second table $TA_R$ as shown in FIG. 4 is previously provided for the memory 32. Previously written in the second table TAR are combinations of each pattern and the optimal VCO 1 for each case. There are three cases: the pattern "1, 1, 1" for a case 1; "1, 1, 0" for a case 2; and "0, 1, 1" for a case 3.

Note that no other pattern exists, because, in consideration of manufacturing dispersion of the VCO $1_1$, VCO $1_2$ and VCO $1_3$, three $f_O$ vs. $V_C$ characteristic curves are shifted within only a predetermined range (by the degree of several percent of $F_{VC}$) to the high frequency side or the low frequency side (refer to FIG. 2). Consequently, for example, as to the VCO $1_1$, VCO $1_2$ and VCO $1_3$, the saturation regions of any two of the $f_O$ vs. $V_C$ characteristic curves do not fall into the receive band B at the same time. It is therefore not necessary to consider other patterns such as 0, 0, 1.

Also previously written in the second table $TA_R$ is the optimal VCO 1 to be used by the receiver for down-converting the signal S from outside for each pattern. That is, in the pattern of the case 1, the VCO $1_2$ is the optimal VCO 1. When the pattern data such as in the case 1 is obtained, the PLL circuit 2 locks using the local oscillation output generated in all of the VCOs 1. The $f_O$ vs. $V_C$ characteristic curve of each of the VCOs 1 is, as shown in FIG. 5*a*, as the design target. In this case, referring to FIG. 5*a*, it can be seen that the linear region of the $f_O$ vs. $V_C$ characteristic curve of the VCO $1_2$ most reliably covers the receive band B, and therefore the VCO $1_2$ is the optimal VCO 1 (refer to a dotted row of FIG. 5*a*').

Figure 5B:
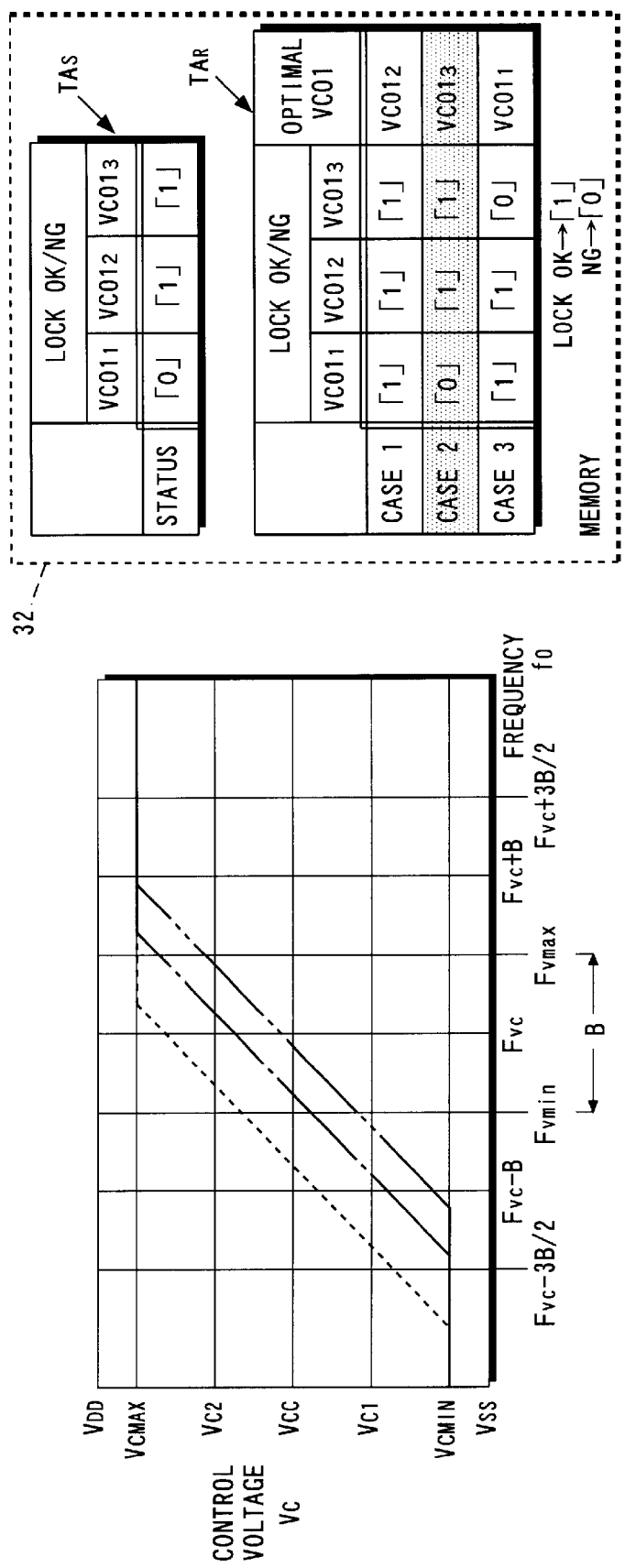
FIGS. 5a, 5a', 5b, 5b', 5c and 5c' are diagrams for describing the relation between the $f_O$ vs. VC characteristics of the VOC $1_1$ to the VOC $1_3$, and the first and second tables $TA_S$ and $TA_R$.

In the case 2, the VCO $1_3$ is the optimal VCO 1. When the pattern data such as in the case 2 is obtained, the PLL circuit 2 locks using the local oscillation output generated in the VCO $1_2$ or the VCO $1_3$. At this time, as compared with the case shown in FIG. 5*a*, the $f_O$ vs. $V_C$ characteristic curves are shifted as a whole to the low frequency side by the frequency B due to manufacturing dispersion, as shown in FIG. 5*b*. In this case, the linear region of the $f_O$ vs. $V_C$ characteristic curve of the VCO $1_3$ most reliably covers the receive band B, and therefore the VCO $1_3$ is the optimal VCO 1 (refer to a dotted row of FIG, 5*b*').

Furthermore, in the case 3, the VCO $1_1$ is the optimal VCO 1. When the pattern data such as in the case 3 is obtained, the PLL circuit 2 locks using the local oscillation output generated in the VCO $1_1$ or the VCO $1_2$. At this time, as compared with the case shown in FIG. 5*a*, the $f_O$ vs. $V_C$ characteristic curves are shifted as a whole to the high frequency side by the frequency B, as shown in FIG. 5*c*. In this case, the linear region of the $f_O$ vs. $V_C$ characteristic curve of the VCO $1_1$ most reliably covers the receive band B, and therefore the VCO $1_1$ is the optimal VCO 1 (refer to a dotted row of FIG. 5*c*').

The receive control portion 31 determines n=$n_{MAX}$ in step S309, and then determines the optimal VCO 1 referring to the second table $TA_R$ (step S315). The pattern data created in the first table $TA_S$ (refer to FIG. 4) matches any one of the patterns of the case 1 to case 3 in the second table $TA_R$. The receive control portion 31 retrieves the case which matches the created pattern data and the optimal VCO 1 for the case.

Described next is operation of the receive control portion 31 in step S315 more specifically. When the created pattern data matches the case $1_1$ the receive control portion 31 determines that the VCO $1_2$ is the optimal VCO 1 (refer to the dotted row of FIG. 5*a*'). When the created pattern data matches the case 2, the receive control portion 31 determines that the VCO $1_3$ is the optimal VCO 1 (refer to the dotted row of FIG. 5*b*'). When the created pattern data matches the case 3, the receive control portion 31 determines that the VCO $1_1$ is the optimal VCO 1 (refer to the dotted row of FIG. 5*c*').

The receive control portion 31 next sends out Sel$_{OPT}$ (step S316) to notify the VCO switching circuit 4 of the optimal VCO 1 determined in step S315. Sel$_{OPT}$ has tree types, like Sel. The VCO switching circuit 4 determines the type of the inputted Sel$_{OPT}$ to recognize the optimal VCO 1 (step S317). The VCO switching circuit 4 then outputs $V_{B1}$, $V_{B2}$ or $V_{B3}$ as described above in order to activate the optimal VCO 1 (step S304, S311 or S313). As a result, of the VCO $1_1$, VCO $1_2$ and VCO $1_3$, the determined optimal VCO 1 is activated (step S305, S312 or S314). The receive control portion 31 thus ends the test mode.

When the above test mode ends, the receiver starts a receive mode. In the receive mode, the predetermined signal S (frequency $f_S$) coming from outside is inputted to the antenna, and the inputted signal S is amplified by the RF amplifier 7. The amplified signal S is inputted to the mixer 6. Also inputted to the mixer 6 is the local oscillation output $V_O$ (frequency $f_{VO}$) from the optimal VCO 1 determined in the test mode. The mixer 6 down-converts the inputted signal S with the local oscillation output. Also in the receive mode, the PLL circuit 2 controls the oscillation frequency $f_{VO}$ of the determined VCO 1 by the control signal $V_C$ generated in the above described manner, so that the oscillation frequency $f_{VO}$ which is fed back and then divided by the programmable divider 21 matches the frequency $f_{REF}$.

As described above, according to the receiver of the first embodiment, the receive control portion 31 determines in step S307 whether the PLL circuit 2 locks for each VCO 1. In step S308, the receive control portion 31 writes the determination result as the status into the first table $TA_S$ (refer to FIG. 4). The receive control portion 31 then determines in step S315 the optimal VCO 1 referring to the second table $TA_R$ and the first table $TA_S$.

Described next is a receiver according to a second embodiment of the present invention. The structure of the receiver is shown in FIG. 1 and its description is omitted herein.

Figure 6:
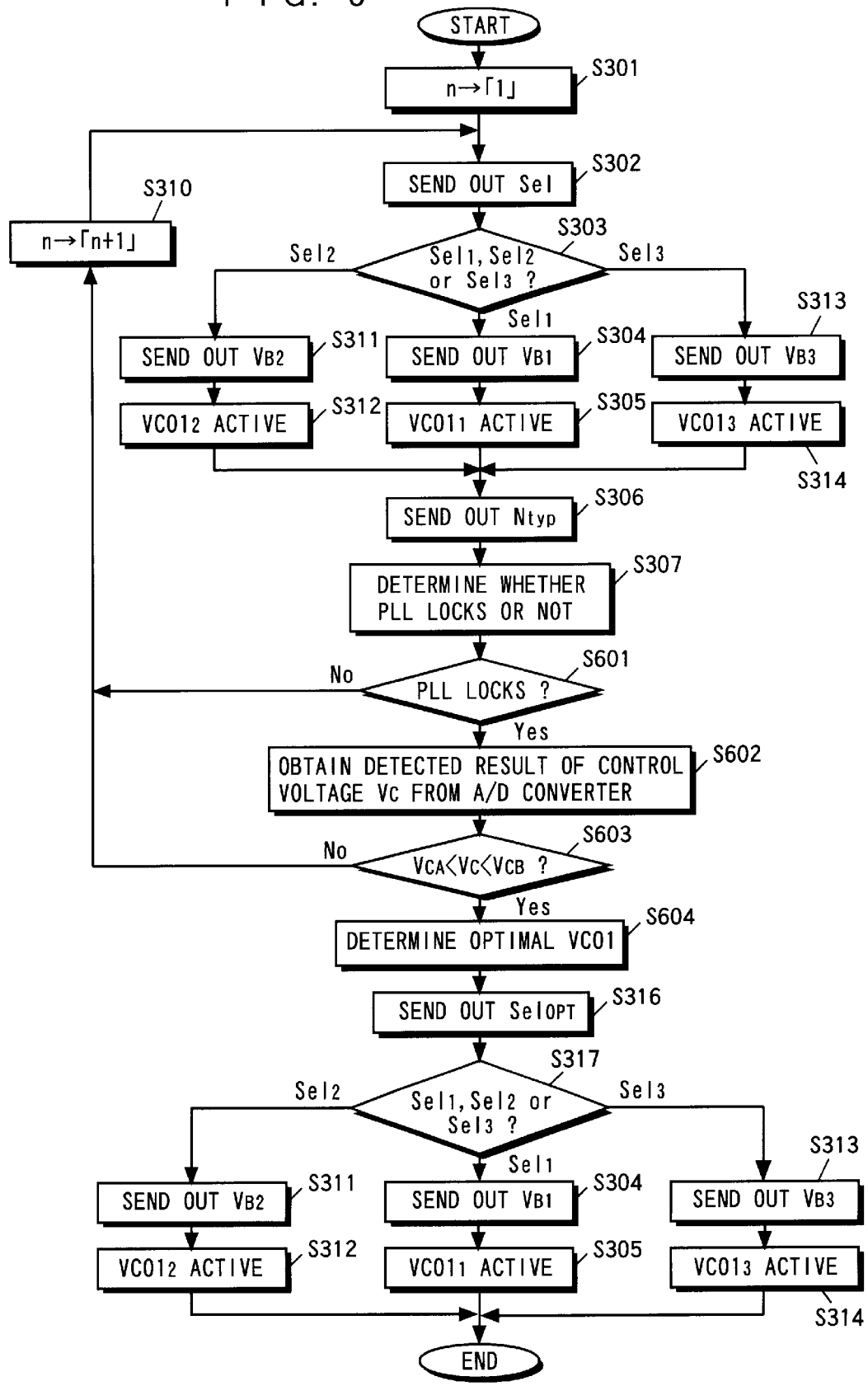
FIG. 6 is a flow chart showing the procedure of a test mode of the second embodiment.

FIG. 6 is a flow chart showing the procedure of a test mode to be executed by the receiver according to the second embodiment. Note that the flow chart of FIG. 6 includes some steps which are the same as those in the flow chart of FIG. 3. Therefore, the corresponding steps are provided with the same step numbers as in FIG. 3, and their description is omitted. Described below is operation of the receiver based on FIGS. 1 and 6.

In FIG. 6, the procedure before step S601 is the same as the procedure up until step S307 in FIG. 3. At the end of step S307, the receive control portion 31 determines whether the PLL circuit 2 locks using the local oscillation output generated in the active VCO 1 (step S307).

When determining that the PLL circuit 2 does not lock (step S601), the receive control portion 31 determines that the active VCO 1 cannot be the optimal VCO $1_1$ and updates "n" to "n+1" (step S310), selecting the VCO 1 with the next VCO number provided, and the procedure advances to step S302.

On the other hand, when determining that the PLL circuit 2 locks (step S601), the receive control portion 31 activates the A/D converter 33. As a result, the control voltage $V_C$ outputted from the LPF 25 is inputted to the A/D converter 33. The A/D converter 33 subjects the control voltage $V_C$ to A/D conversion, measuring and digitizing the control voltage $V_{C1}$ and then sends out the result to the receive control portion 31.

Figure 7A:
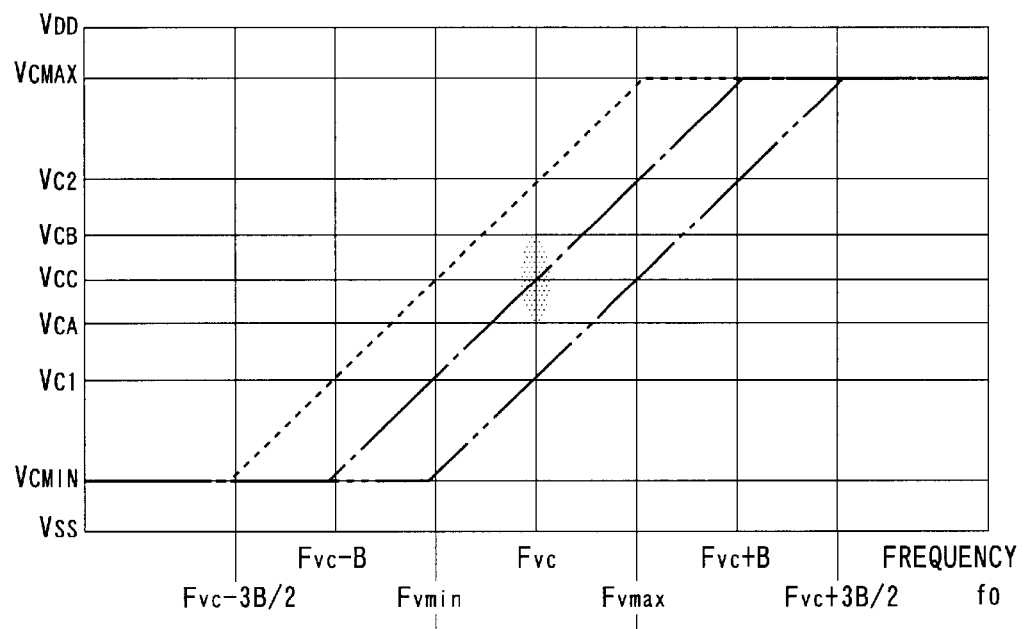
FIGS. 7a and 7b are diagrams for describing $V_{CA}$ and $V_{CB}$ in the second embodiment.
Figure 7B:
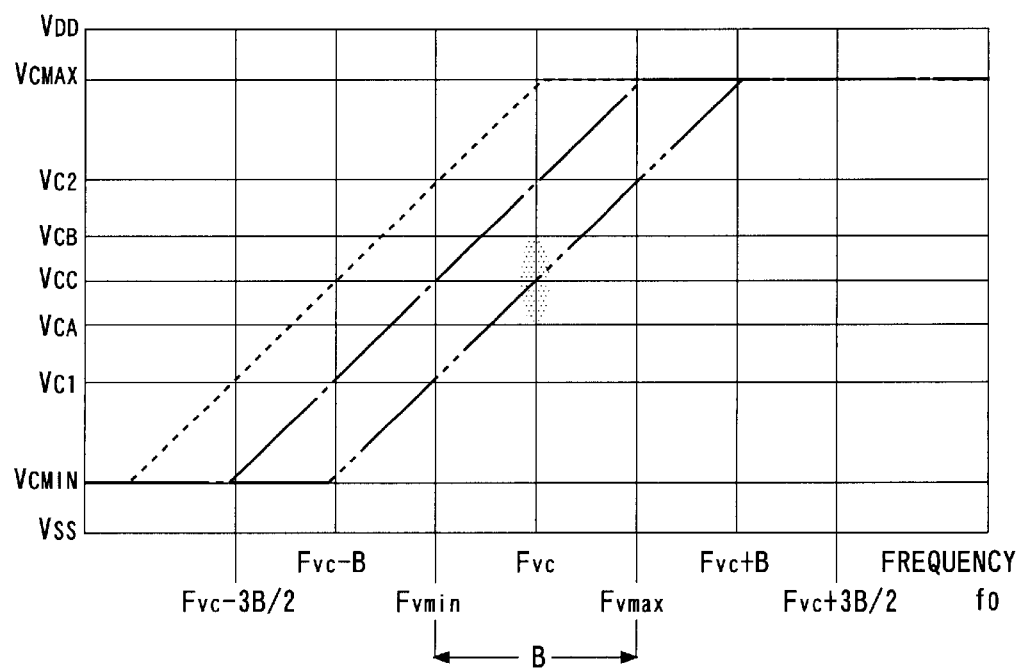

The receive control portion 31 next determines whether the value of the inputted control voltage $V_C$ satisfies a conditional equation $V_{CA}<V_C<V_{CB}$ (2) (step S603). $V_{CA}$ and $V_{CB}$ of the conditional equation (2) are now described referring to FIGS. 7a and 7b. As described above, when $N_{typ}$ is set in the programmable divider 21, each of the VCOs 1 generates the local oscillation output $V_O$ having the oscillation frequency $F_{VC}$. At this time, however, the control voltages $V_C$ applied to the VCOs 1 are different from each other: $V_{CC}$ is applied to the VCO $1_2$, $V_{C2}$ to the VCO $1_1$ and $V_{C1}$ to the VCO $1_3$. $V_{CA}<V_C<V_{CB}$ covers a range smaller than $V_{CMIN}<V_C<V_{CMAX}$ in which the the PLL circuit 2 reliably locks, and the range does not include the plurality of control voltages $V_C$ of the VCOs 1, as shown in FIG. 7a. That is, in FIG. 7a, $V_{CA}<V_C<V_{CB}$ is represented by a dotted area, and only the control voltage $V_C$ of the VCO $1_2$ is included in this range. $V_{CA}$ and $V_{CB}$ are thus determined. Furthermore, manufacturing dispersion of the VCOs are considered for determining $V_{CA}$ and $V_{CB}$.

When the above value does not satisfy the conditional equation (2) in step S603, the receive control portion 31 determines that the active VCO 1 is not the optimal one, updates "n" to "n+1" (step S310), and then the procedure advances to step S302 in order to determine whether the VCO 1 with the next VCO number is the optimal one or not.

On the other hand, when the above value satisfies the conditional equation (2), the receive control portion 31 determines in step S603 that the active VCO 1 is the optimal one (step S604).

In FIG. 6, the procedure after step S604 is the same as the procedure from step 316 and thereafter in FIG. 3.

According to the above described test mode, when each VCO 1 has the $f_O$ vs. $V_C$ characteristic as the design target, as evident from FIG. 7a, the VCO $1_2$ is selected as the optimal VCO 1. However, as compared with FIG. 7a, when the $f_O$ vs. $V_C$ characteristics of the VCOs 1 are shifted as a whole to the low frequency side due to manufacturing dispersion (refer to FIG. 7b), the VCO $1_3$ is selected as the optimal VCO 1 in some cases. Note that, since it is clear from the above description that the VCO $1_1$ is selected as the optimal VCO 1 in some cases when the $f_O$ vs. $V_C$ characteristics of the VCOs 1 are shifted to the high frequency side, its illustration in particular is omitted herein.

As described above, according to the receiver of the second embodiment, as in the first embodiment, an optimal VCO 1 is determined. The receiver according to the first embodiment determines whether the PLL circuit 2 locks as to all VCOs 1. However, the receiver of the second embodiment determines in sequence whether the PLL circuit 2 locks for each VCO 1, and once the optimal VCO 1 is determined, the mixer 8 can immediately perform down-converting of the signal S with the determined optimal VCO 1. This increases the speed of the test mode. Described next is operation of a receiver according to a third embodiment of the present invention. The structure of the receiver is shown in FIG. 1 and its description is omitted herein.

Figure 8:
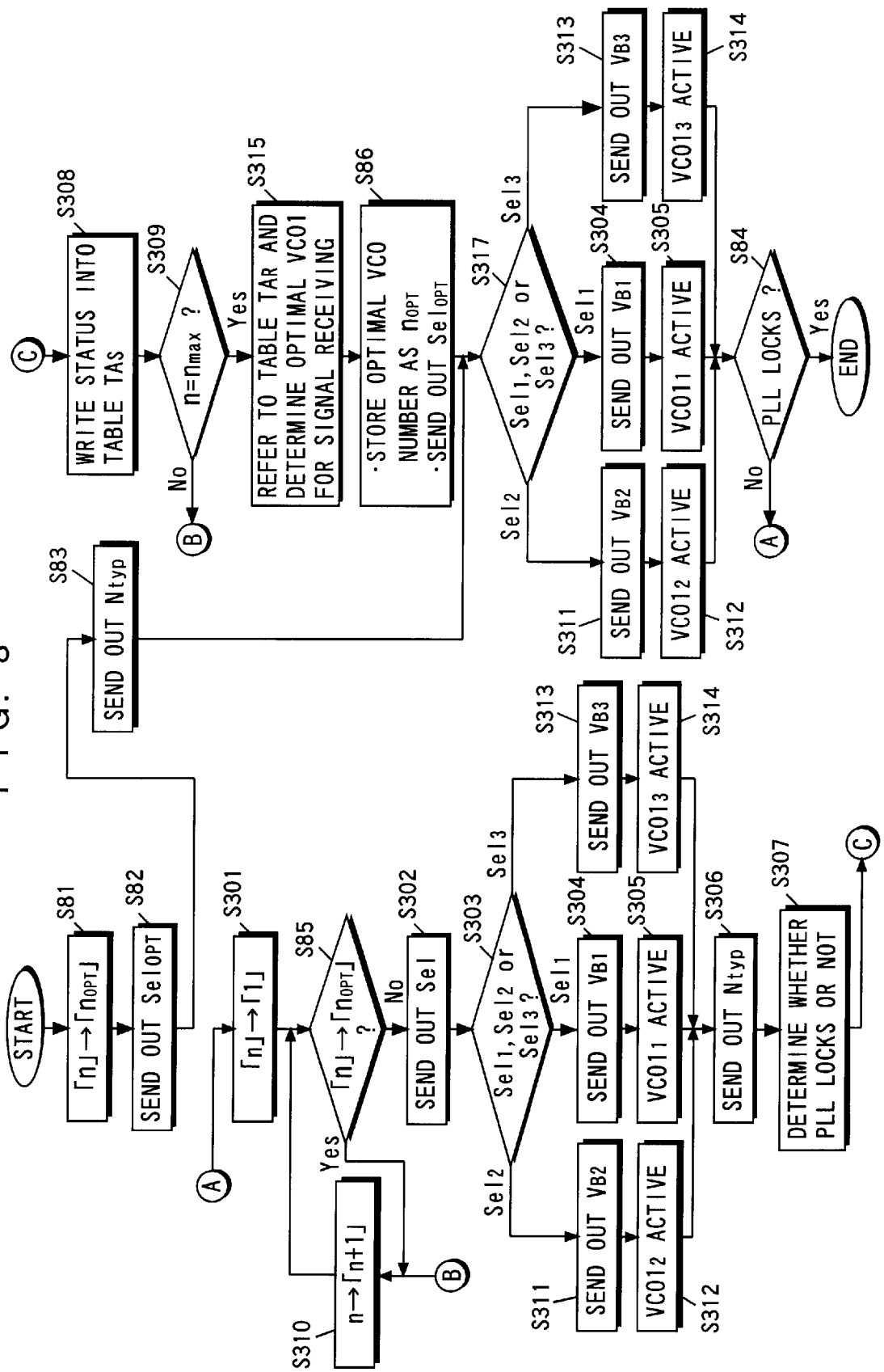
FIG. 8 is a flow chart showing the procedure of a test mode of the third embodiment.

FIG. 8 shows a flow chart showing the procedure of a test mode to be executed by the receiver according to the third embodiment. Note that the flow chart of FIG. 8 includes some steps which are the same as those in the flow chart of FIG. 3. Therefore, the corresponding steps are provided with the same step numbers as in FIG. 3, and their description is omitted. Described below is operation of the receiver based on FIGS. 1 and 8.

Step S315 of FIG. 8 is the same as step S315 of FIG. 3. That is, the receive control portion 31 determines n=nmx in step S309, and then determines the optimal VCO 1 referring to the first table TA, and the second table $TA_R$ (step S315).

Figure 9:
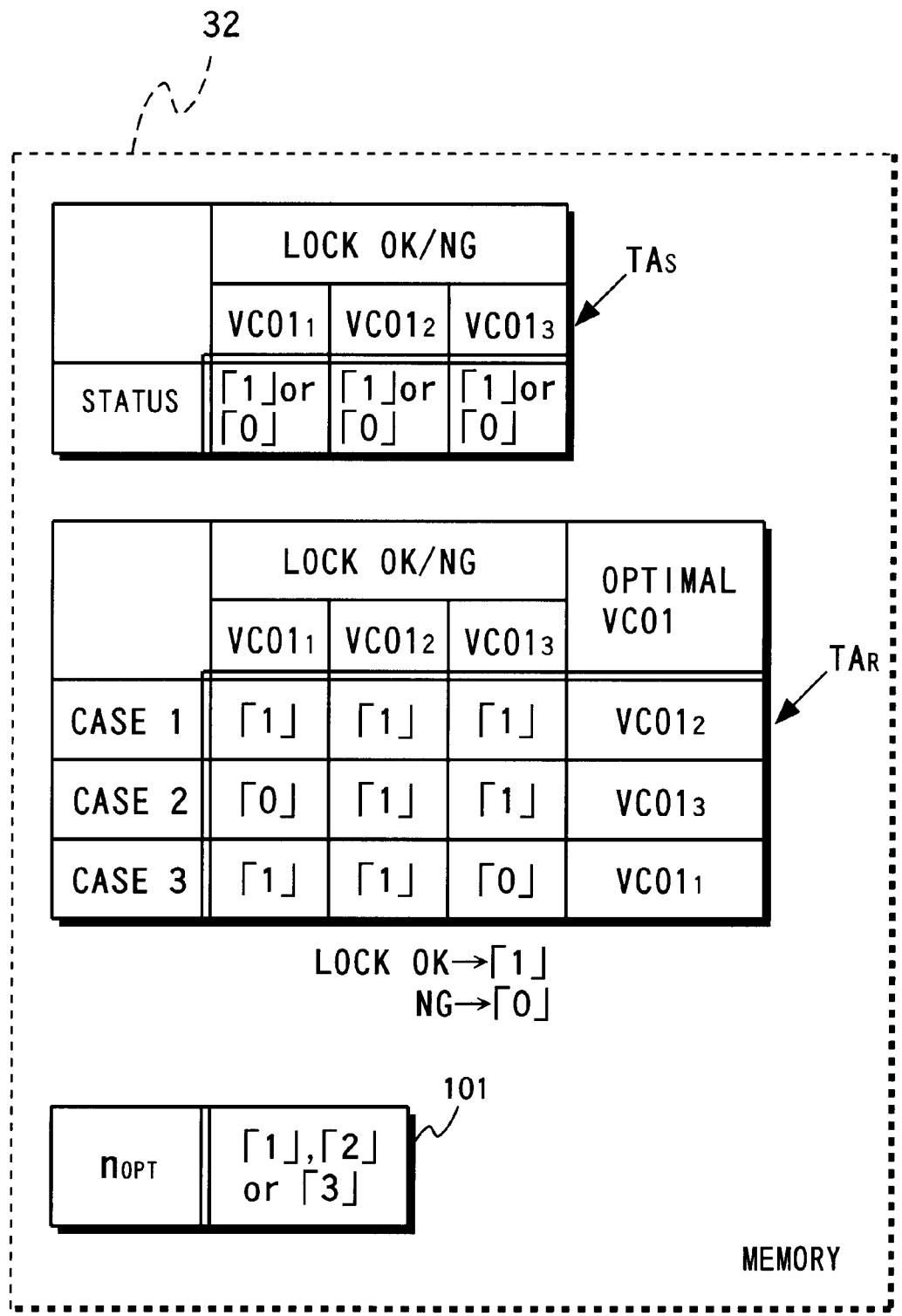
FIG. 9 is a diagram for describing $n_{OPT}$ stored in memory 32 of the third embodiment.

The receive control portion 31 then sends out $Sel_{OPT}$ to notify the VCO switching circuit 4 of the optimal VCO 1 selected in step S315, and writes the VCO number of the optimal VCO 1 as "$n_{OPT}$" into a field 101 (refer to FIG. 9) previously provided in the memory 32 (step S86). Written into this field 101 is "1", "2" or "3".

After that, the receiver executes steps S317→S304→S305, steps S317→S311→S312 or steps S317→S313→S314 in sequence, and then step S84. In step S84, the receive control portion 31 determines whether the PLL circuit 2 locks with the optimal VCO 1 active in step S307. Note that, when the receive control portion 31 executes step S84 immediately after determining the optimal VCO 1, such as when steps S315→S86→S317→S304→S305 are executed in sequence, the PLL circuit 2 locks as a matter of course, and therefore the receive control portion 31 ends the test mode. The receiver then starts the receive mode. After that, the receiver is powered off as required.

The receiver is powered on again as required. The receive control portion 31 starts the test mode immediately after the power-on, first taking out the VCO number "$n_{OPT}$" of the optimal VCO 1 determined last time from the field 101 in the memory 32 and setting the initial value of the VCO number "n" to "$n_{OPT}$" (step S81). The receive control portion 31 next sends out $Sel_{OPT}$ (step S82) to notify the VCO switching circuit 4 of the preceding optimal VCO 1 set in step S81. The receive control portion 31 then sends out $N_{typ}$ (step S83) to set the dividing ratio of the programmable divider 21.

After that, the receiver executes steps S317→S304→S305, steps S317→S311→S312 or steps S317→S313→S314 in sequence according to the value of "$n_{OPT}$" stored in the field 101, and the receive control portion 31 then determines whether the PLL circuit 2 locks with the preceding optimal VCO 1 active (step S84). Unlike the above case, it is not sure that the PLL circuit 2 reliably locks when the preceding optimal VCO 1 is activated, because its circuit constant may change from the initial constant by secular changes of the IC. That is why step S84 is required. The receive control portion 31 ends the test mode when the PLL circuit 2 locks in S84.

As described above, according to the receiver of the third embodiment, as in the first embodiment, an optimal VCO 1 is determined. Furthermore, at the time of powering-on the receiver again, when the PLL circuit 2 locks using the preceding optimal VCO 1 active, the receive control portion 31 continues to use this VCO 1. In this way, unlike in the first embodiment, in some cases, the receiver of the third embodiment does not have to execute processing such as writing the status into the first table $TA_S$ and determining the optimal VCO 1 by comparison of the first table $TA_S$ and the second table $TA_R$. This allows reduction in time between power-on of the receiver and the receive mode, as compared with the first embodiment.

When the PLL circuit 2 does not lock, the receive control portion 31 starts in step S84 the same test mode as that of the first embodiment. However, at this time, it is not required to activate again the VCO 1 with the number corresponding to "$n_{OPT}$" stored in the field 101 and determine whether the PLL circuit 2 locks. Therefore, the receive control portion 31 executes step S85 and does not activate the VCO 1 with the above VCO number "$n_{OPT}$" this time. This increases the speed of the test mode.

Described next is a receiver according to a fourth embodiment of the present invention. The structure of the receiver is shown in FIG. $1_1$ and its description is omitted.

Figure 10:
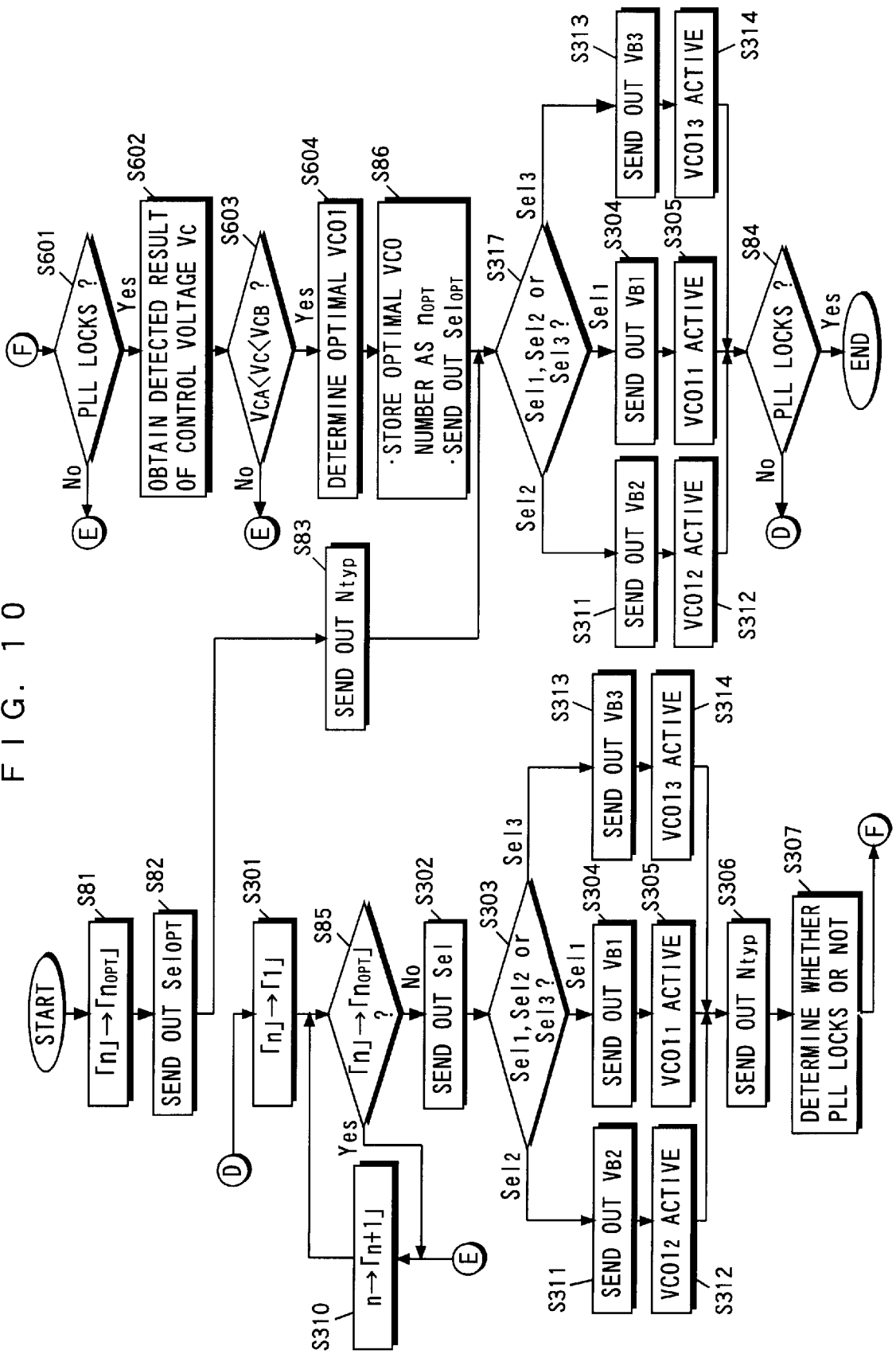
FIG. 10 is a flow chart showing the procedure of a test mode of the fourth embodiment.
Figure 11:
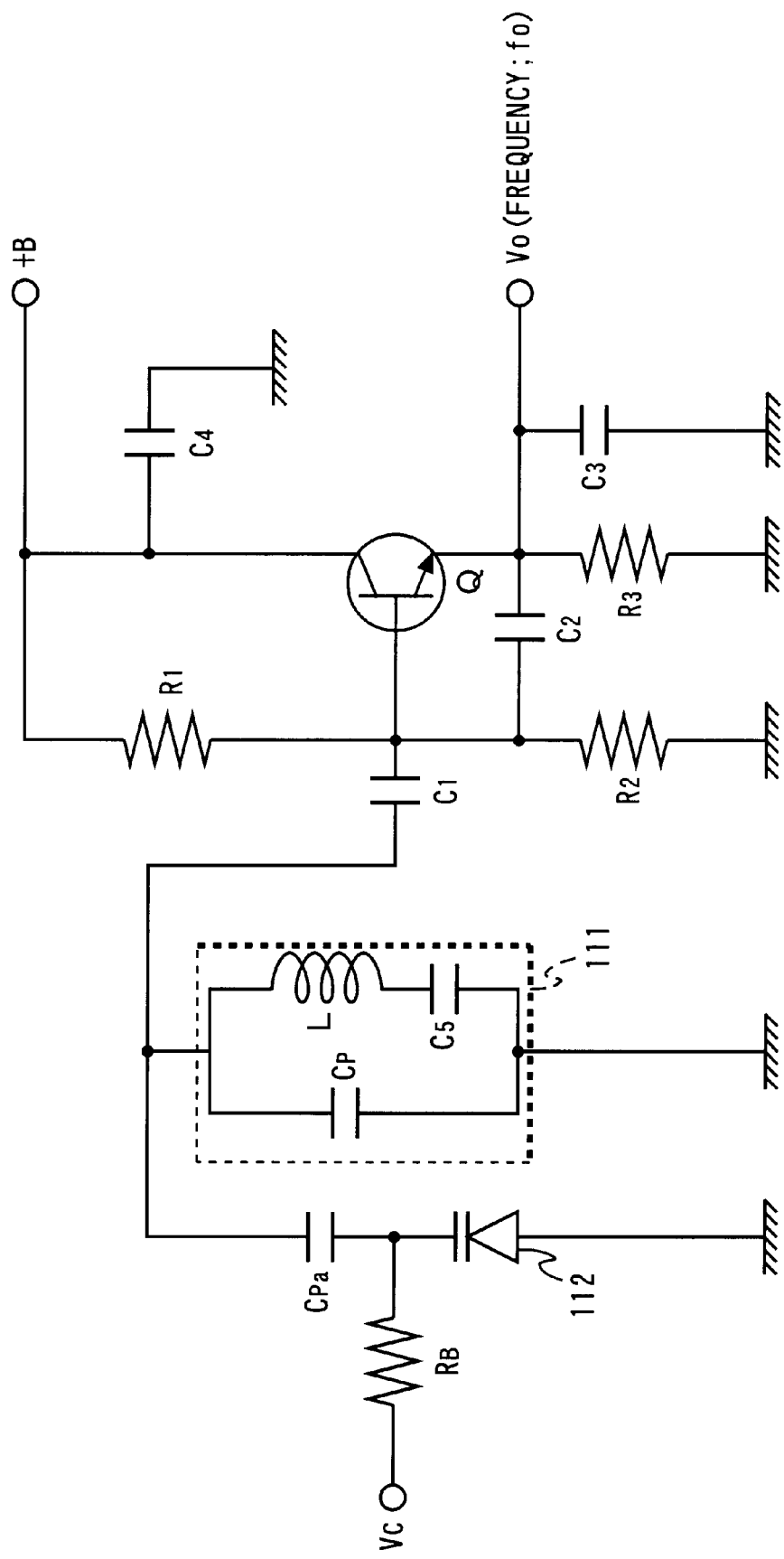
FIG. 11 shows an example of structure of a conventional VCO including an SAW resonator.
Figure 12:
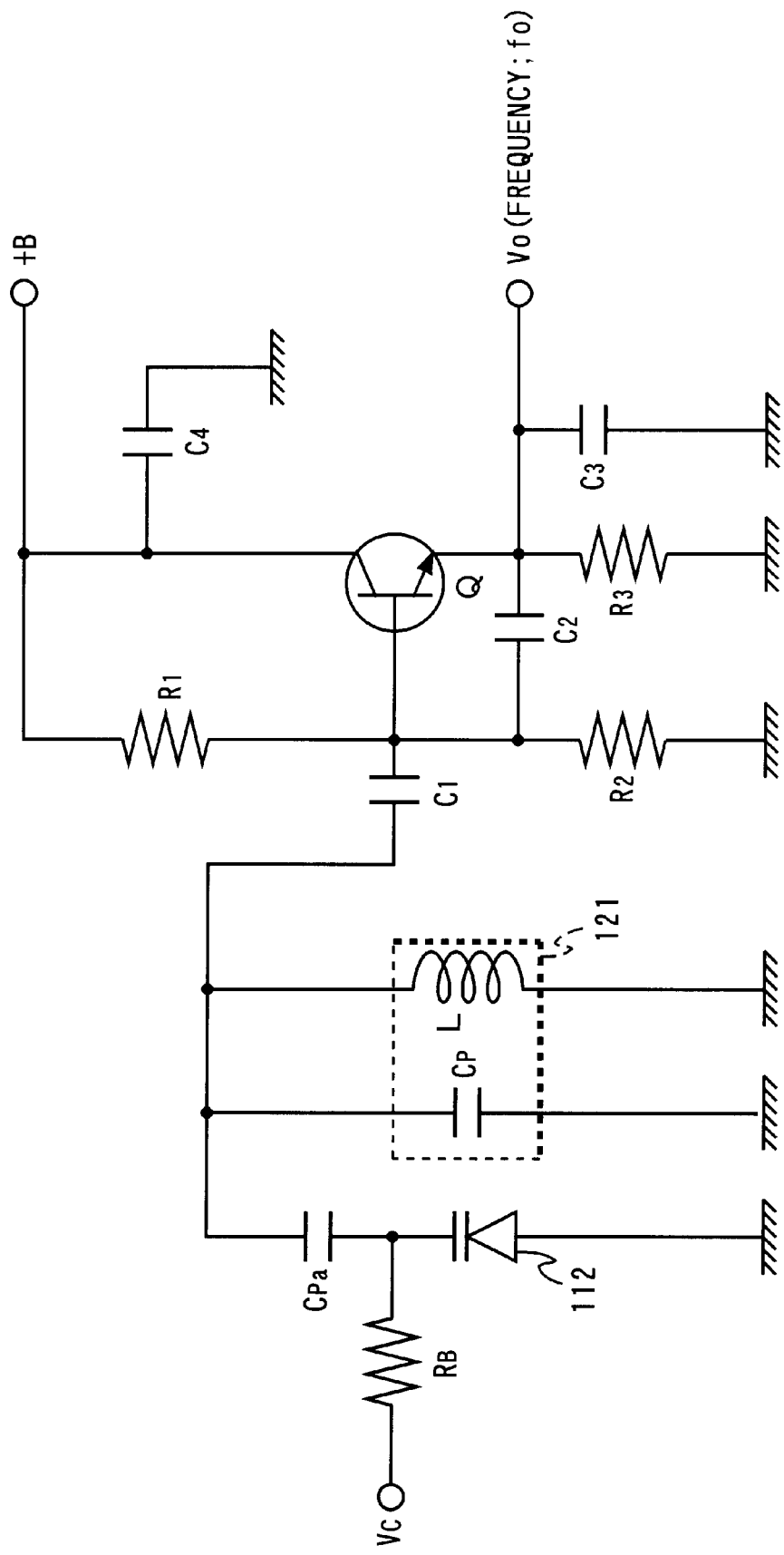
FIG. 12 shows an example of structure of another conventional VCO including an LC resonator.
Figure 13:
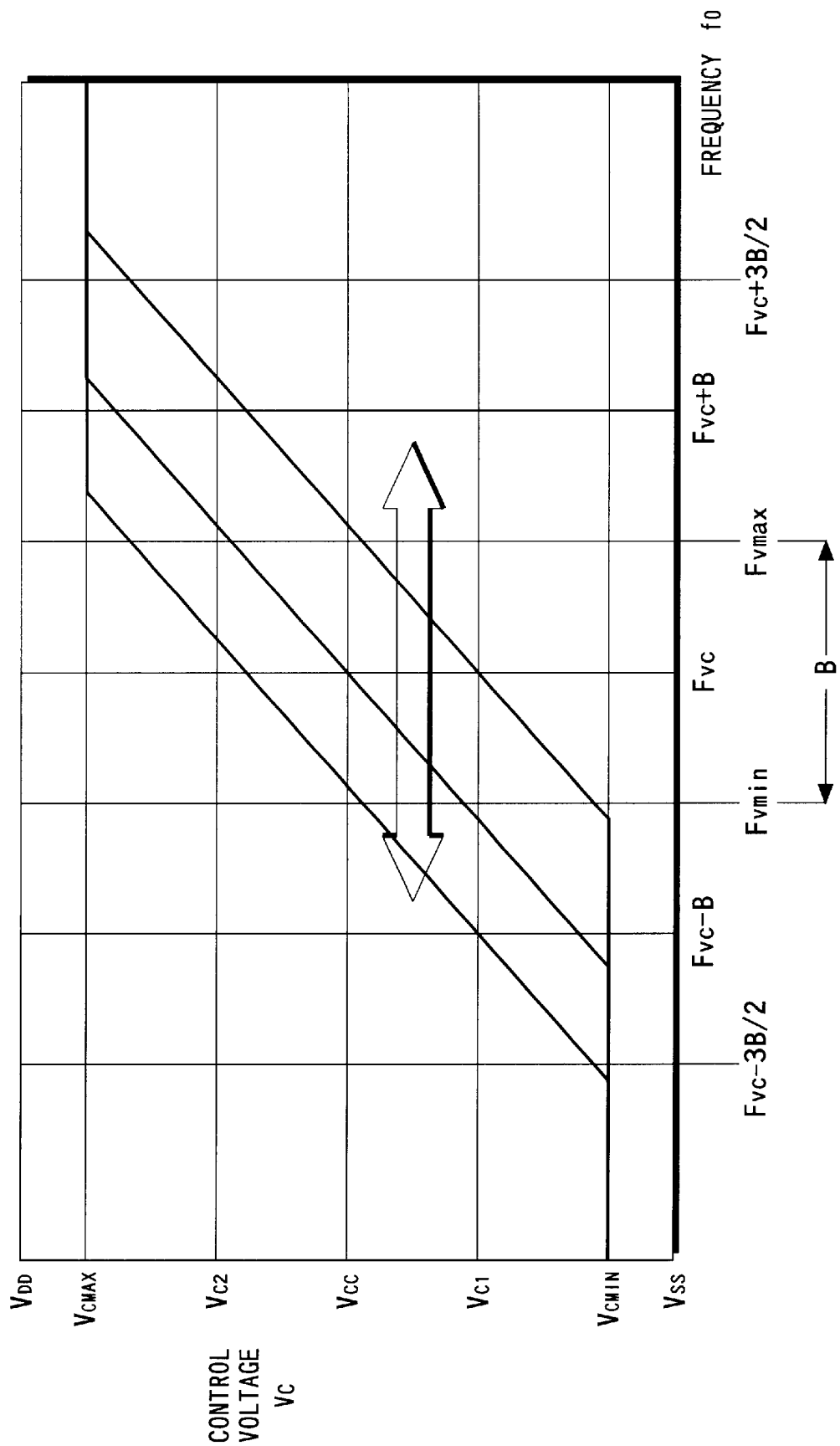
FIG. 13 shows $f_O$ vs. $V_C$ characteristic curves of the VCOs of FIG. 12.

FIG. 10 is a flow chart showing the procedure of the test mode to be executed by the receiver according to the fourth embodiment. Note that the flow chart of FIG. 10 includes some steps which are the same as those in the flow charts of FIGS. 6 and 8. Therefore, the corresponding steps are provided with the same step numbers as in FIGS. 6 and 8, and their description is simplified. Described below is operation of the receiver based on FIGS. 1 and 10.

Step S604 of FIG. 10 is the same as step S604 of FIG. 6. That is, when the measured result of the control voltage $V_C$ obtained from the A/D converter 33 satisfies the above conditional equation (2), the receive control portion 31 determines that the active VCO 1 is the optimal one(step S604). The receive control portion 31 then writes "$n_{OPT}$" into the field 101 (refer to FIG. 9) in the memory 32 (step S86). After that, the receiver executes Steps S317→S304→S305, steps S317→S311–S312 or steps S317→S313→S314 in sequence according to the selected VCO 1.

As in the third embodiment, the receive control portion 31 next checks to determine whether the PLL circuit 2 locks with the determined optimal VCO 1 active (step S84), and ends the test mode. The receiver then starts the receive mode. After that, the receiver is powered off as required.

The receiver is powered on again as required. The receive control portion 31 executes steps S81 to S83 immediately after the power-on, as in the third embodiment. After that, the receiver executes steps S317→S304→S305, steps S317→S311→S312 or steps S317→S313→S314 in sequence according to the value of "$n_{OPT}$" stored in the field 101. The receive control portion 31 then executes step S84 as in the third embodiment, and when determining that the PLL circuit 2 locks, decides to continue to use the preceding optimal VCO 1 for down-conversion.

As described above, according to the receiver of the fourth embodiment, as in the second embodiment, an optimal VCO 1 is determined at high speed, and furthermore, in the same manner as that in the third embodiment, the time between power-on of the receiver and the receive mode is reduced.

In step S84, the receive control portion 31 starts the same test mode as in the second embodiment when the PLL circuit 2 does not lock, and the same step S85 in the third embodiment increases the speed of the test mode.

While the invention has been described in detail, the foregoing description is in all aspects illustrative and not restrictive. It is understood that numerous other modifications and variations can be devised without departing from the scope of the invention.

What is claimed is:

1. A receiver for subjecting a signal inputted via an antenna to down-conversion and then demodulating the converted signal, the inputted signal occupying a predetermined frequency band, said receiver comprising:

a plurality of voltage controlled oscillators (hereinafter referred to as VCOs), each VCO provided with a common control voltage, each VCO generating a local oscillation output, each local oscillation output having a frequency different from the other local oscillation outputs according to the control voltage, each of said VCOs being operable to operate at an oscillation frequency band that includes the predetermined frequency band;

a PLL circuit for generating the control voltage based on (a) a local oscillation output, fed back from a selected one of said VCOs, and (b) a reference signal having a reference frequency;

a mixer for mixing frequencies of the signal inputted via the antenna and the local oscillation output from said selected one of said VCOs, and performing down-conversion; and a VCO control portion for testing each of said VCOs in a test mode, and controlling switching of said VCOs in a receive mode of receiving the signal inputted via the antenna;

wherein in the test mode, said VCO control portion detects whether said PLL circuit locks using the local oscillation output from each of said VCOs and determines one appropriate VCO based on a detected result, wherein in the receive mode, said VCO control portion selectively activates the VCO determined in the test mode, and provides the local oscillation output from the activated VCO to said mixer, and wherein said VCO control portion holds the detected results in a first table as pattern data, refers to a second table into which the appropriate VCO for each previously assumed pattern is written, and determines the appropriate VCO corresponding to the pattern data held in the first table.

2. The receiver as claimed in claim 1, wherein the second table is configured based on manufacturing dispersion of said VCOs.

3. A receiver for subjecting a signal inputted via an antenna to down-conversion and then demodulating the converted signal, the inputted signal occupying a predetermined frequency band, said receiver comprising:

a plurality of voltage controlled oscillators (hereinafter referred to as VCOs), each VCO provided with a common control voltage, each VCO generating a local oscillation output, each local oscillation output having a frequency different from the other local oscillation outputs according to the control voltage, each of said VCOs being operable to operate at an oscillation frequency band that includes the predetermined frequency band;

a PLL circuit for generating the control voltage based on (a) a local oscillation output, fed back from a selected one of said VCOs, and (b) a reference signal having a reference frequency;

a mixer for mixing frequencies of the signal inputted via the antenna and the local oscillation output from the selected one of said VCOs, and performing down-conversion;

a VCO control portion for testing each of said VCOs in a test mode, and controlling switching of said VCOs in a receive mode of receiving the signal inputted via the antenna; and an internal memory, wherein in the test mode, said VCO control portion activates one of said VCOs, performs a determination processing to determine whether said PLL circuit locks using the local oscillation output from said one of said VCOs, performs a writing processing to write a result of the determination processing into said internal memory, performs the determination processing and writing processing on each of the remaining VCOs, and determines one optimal VCO from said plurality of VCOs by referring to the results of the determination processing written in said internal memory, wherein in the receive mode, said VCO control portion activates said optimal VCO determined in the test mode, and provides the local oscillation output from said optimal VCO to said mixer, and wherein said VCO control portion instructs said internal memory to store the detected results of the determination processing in a first table as first pattern data and determines said optimal VCO corresponding to the first pattern data based on second pattern data of previous results of a previous determination processing of each VCO within a second table.

4. The receiver as claimed in claim 3, wherein the second table is configured based on manufacturing dispersion of said VCOs.

5. A receiver for subjecting a signal inputted via an antenna to down-conversion and then demodulating the converted signal, the inputted signal occupying a predetermined frequency band, said receiver comprising:

a plurality of voltage controlled oscillators (hereinafter referred to as VCOs), each VCO provided with a common control voltage, each VCO generating a local oscillation output, each local oscillation output having a frequency different from the other local oscillation outputs according to the control voltage, each of said VCOs being operable to operate at an oscillation frequency band that includes the predetermined frequency band;

a PLL circuit for generating the control voltage based on (a) a local oscillation output, fed back from a selected one of said VCOs, and (b) a reference signal having a reference frequency;

a mixer for mixing frequencies of the signal inputted via said antenna and the local oscillation output from said selected one of said VCOs, and performing down-conversion;

a VCO control portion for testing each of said VCOs in a test mode, and controlling switching of said VCOs in a receive mode of receiving the signal inputted via said antenna; and an internal memory, wherein in the test mode, said VCO control portion activates one of said VCOs, performs a determination processing to determine whether said PLL circuit locks using the local oscillation output from said one of said VCOs, performs a writing processing to write a result of the determination processing into said internal memory, performs the determination processing and writing processing on each of the remaining VCOs, and determines one optimal VCO from said plurality of VCOs by referring to the results of the determination processing written in said internal memory; and wherein in the receive mode, said VCO control portion activates the VCO determined in the test mode, and provides the local oscillation output from the activated VCO to said mixer.

* * * * *